US012596149B2

(12) United States Patent
Cheng et al.

(10) Patent No.: US 12,596,149 B2
(45) Date of Patent: Apr. 7, 2026

(54) DIAGNOSING IDENTICAL CIRCUIT BLOCKS IN DATA STREAMING ENVIRONMENT

(71) Applicant: Siemens Industry Software Inc., Plano, TX (US)

(72) Inventors: Wu-Tung Cheng, Lake Oswego, OR (US); Manish Sharma, Wilsonville, OR (US); Mark A. Kassab, Wilsonville, OR (US)

(73) Assignee: Siemens Industry Software Inc., Plano, TX (US)

( * ) Notice: Subject to any disclaimer, the term of this patent is extended or adjusted under 35 U.S.C. 154(b) by 53 days.

(21) Appl. No.: 18/238,680

(22) Filed: Aug. 28, 2023

(65) Prior Publication Data

US 2025/0076376 A1      Mar. 6, 2025

(51) Int. Cl.
*G01R 31/317* (2006.01)

(52) U.S. Cl.
CPC . *G01R 31/31713* (2013.01); *G01R 31/31727* (2013.01)

(58) Field of Classification Search
CPC .................... G01R 31/31713; G01R 31/31727
See application file for complete search history.

(56) References Cited

U.S. PATENT DOCUMENTS

| | | | |
|---|---|---|---|
| 9,222,978 B2 | 12/2015 | Huang et al. | |
| 10,473,721 B1 * | 11/2019 | Cote ................ | G01R 31/31725 |
| 10,867,096 B1 * | 12/2020 | Ossman ................ | G06F 30/34 |
| 2014/0132304 A1 * | 5/2014 | Haiut ................... | H04R 3/005 327/155 |
| 2016/0149697 A1 * | 5/2016 | Doege ................... | G09C 1/00 713/189 |
| 2022/0164297 A1 * | 5/2022 | Sity ................... | G06F 12/1458 |

OTHER PUBLICATIONS

G. Giles et al., "Test Access Mechanism for Multiple Identical Cores," IEEE International Test Conference, 2008, pp. 1-10.

* cited by examiner

*Primary Examiner* — Mark D Featherstone
*Assistant Examiner* — Jeffrey Andrew Yang

(57) ABSTRACT

A circuit comprises: a plurality of identical circuit blocks, each of the plurality of identical circuit blocks comprising one or more test output ports; a first bit-combining device and a second bit-combining device for each of the one or more test output ports; a delay device for each of the one or more test output ports; and a network coupled to each of the plurality of identical circuit blocks and configured to transport a first bit stream and a second bit stream during a test, wherein the first bit-combining device and the second bit-combining device are configured to combine bits outputted from the each of the one or more test output ports with bits of the first bit stream and bits of the second bit stream that are delayed by the delay device, respectively.

14 Claims, 9 Drawing Sheets

Captured test
response bits
220

Expected test
response bits
210

X-masking bits
240

Bit stream 257 sticky pass/fail bit
generation circuit 270

To next
circuit block

Device 200

DIAGNOSING IDENTICAL CIRCUIT BLOCKS IN DATA STREAMING ENVIRONMENT

FIELD OF THE DISCLOSED TECHNIQUES

The presently disclosed techniques relate to the field of circuit test and diagnosis. Various implementations of the disclosed techniques may be particularly useful for testing and diagnosing identical circuit blocks.

BACKGROUND OF THE DISCLOSED TECHNIQUES

Multi-core processors are widely used across many application domains, including general-purpose, embedded, network, digital signal processing (DSP), and graphics processing units (GPU). GPUs play a crucial role in artificial intelligence (AI). Each GPU can have a large number of processing units that are architecturally the same or very similar—identical cores. These identical cores allow a GPU to process a high volume of data in parallel. This massive parallelism makes GPUs highly effective for tasks like complex AI model training which involves not only analyzing large datasets but also updating millions or even billions of model parameters based on data. Core count for a latest GPU can go up to 16,000 and it can contain nearly 80 billion transistors.

A circuit having a large number of identical circuit blocks presents both a challenge and an opportunity for circuit test. In hierarchical test methodologies, the scan chains and compression logic are inserted into every circuit block. The test patterns are generated and validated at the circuit block level to test most of the logic in the circuit block. Subsequently, the patterns from multiple circuit blocks are retargeted or mapped to the top level. Pattern retargeting to identical circuit blocks can benefit from the fact that all instances are identical. If the circuit blocks are wrapped and isolated from their surroundings, as usually done in a hierarchical test methodology, then the test stimuli and responses of all circuit block instances are identical. Automatic test pattern generation (ATPG) only needs to be run once to generate the patterns for that circuit block regardless of the number of circuit block instances. Since the inputs are identical, they can be broadcast to all circuit block instances with pipelined inputs. This can save on the number of I/Os needed to test the circuit blocks concurrently. Challenges still remain however. Although broadcast can be used to keep the number of I/Os needed for channel inputs constant, the outputs typically still have to be observed independently to guarantee the same test coverage achieved at the circuit block level and to ensure enough observability for diagnosing failing circuit blocks. If at least 1 output channel is needed per circuit block instance, this limits the number of identical circuit block instances that can be tested concurrently just as there are similar limitations on heterogeneous circuit block instances.

Moreover, the capture cycles are usually synchronized and delivered from a common clock source. To align the capture cycles and shift sequence, while data is being broadcast, the same number of pipeline stages must be used for every circuit block instance regardless of the proximity of the circuit block to the pad driving it. This is further complicated in the presence of a tiling methodology. With tiling, there can be no routing or logic outside the circuit blocks. So the circuit blocks must meet the pipelining and connectivity criteria previously mentioned, all while forming connections through abutment, and having multiple instances that are identical copies of the same module. This can be achieved by employing programmable pipelining and channel output routes, but it adds complexity and limits the reuse of circuit blocks since designing a new chip with more circuit block instance requires redesigning the circuit blocks to account for differences in pipelining and routing channels.

To overcome the drawbacks of broadcasting schemes, various data streaming technologies have been proposed and implemented. A data streaming architecture allows efficient delivery of stimuli and expected values (good-machine responses) and supports on-chip comparison and accumulation of pass/fail data such that multiple identical circuit blocks could be tested in near constant time. In such an architecture, corresponding test response data from each circuit core are typically combined or merged to reduce the data volume to be sent out. This, however, can severely affect defect diagnosis and in many cases make it impossible without rerunning tests on those circuit blocks that are found to be defective.

BRIEF SUMMARY OF THE DISCLOSED TECHNIQUES

Various aspects of the disclosed technology relate to testing and diagnosing identical circuit blocks in a circuit. In one aspect, there is a circuit, comprising: a plurality of identical circuit blocks, each of the plurality of identical circuit blocks comprising one or more test output ports, the one or more test output ports being coupled to outputs of scan chains, outputs of one or more test response compactors, or outputs of comparators; a first bit-combining device and a second bit-combining device for each of the one or more test output ports for each of the plurality of identical circuit blocks; a delay device for each of the one or more test output ports for each of the plurality of identical circuit blocks; and a network coupled to each of the plurality of identical circuit blocks and configured to transport a first bit stream and a second bit stream during a test, wherein the first bit-combining device is configured to update the first bit stream by combining bits of the first bit stream with bits outputted from the each of the one or more test output ports, and the second bit-combining device is configured to update the second bit stream by combining bits of the second bit stream that are delayed by a preset number of scan clock cycles by the delay device with the bits outputted from the each of the one or more test output ports.

The circuit may further comprise: one or more additional bit-combining devices for the each of the one or more test output ports for each of the plurality of identical circuit blocks; and one or more additional delay devices for the each of the one or more test output ports for each of the plurality of identical circuit blocks, wherein each of one or more additional bit-combining devices is configured to update one of one or more additional bit streams by combining bits of the one of one or more additional bit streams that are delayed by a particular number of scan clock cycles by one of the one or more additional delay devices with the bits outputted from the each of the one or more test output ports, the one or more additional delay devices being configured to delay bits by different numbers of scan clock cycles.

The preset number of scan clock cycles may be delivered to the delay device by configuration data before the test.

The bit-combining devices may be OR gates, and each of the one or more delay devices may comprise a register.

The circuit may further comprise: sticky pass/fail bit generation circuitry for each of the plurality of identical circuit blocks.

The circuit may further comprise: another network, wherein the network comprises first data channels and first interface devices, the first interface devices comprising registers and clock signal generation logic, each of the first interface devices being coupled to ports of one of circuit blocks in the circuit comprising the plurality of identical circuit blocks, the first network configurable to transport a plurality of data packets consecutively, each of the plurality of data packets having m bits, each of the m bits being assigned to one of the circuit blocks preconfigured in an active mode, m being equal to or greater than a number of first data channels used for the transporting the plurality of data packets, and wherein the another network comprises one or more second data channels and second interface devices, each of the first interface devices being coupled to one of the second interface devices, the second network configurable to transport configuration data to the first interface devices, the configuration data comprising data for determining whether or not a first interface device in the first interface devices is activated and data for determining which bit or bits of each of the plurality of data packets to be captured, replaced, or captured and replaced by each of the first interface devices activated.

Bits of the first bit stream and bits of the second bit stream may be arranged in data packets transported in the network.

In another aspect, there are one or more non-transitory computer-readable media storing computer-executable instructions for causing one or more processors to perform a method, the method comprising: creating the above circuit in a circuit design.

Certain inventive aspects are set out in the accompanying independent and dependent claims. Features from the dependent claims may be combined with features of the independent claims and with features of other dependent claims as appropriate and not merely as explicitly set out in the claims.

Certain objects and advantages of various inventive aspects have been described herein above. Of course, it is to be understood that not necessarily all such objects or advantages may be achieved in accordance with any particular embodiment of the disclosed techniques. Thus, for example, those skilled in the art will recognize that the disclosed techniques may be embodied or carried out in a manner that achieves or optimizes one advantage or group of advantages as taught herein without necessarily achieving other objects or advantages as may be taught or suggested herein.

BRIEF DESCRIPTION OF THE DRAWINGS

FIG. 7 illustrates an example of bit assignment for the first data channels shown in FIG. 5 used for testing a plurality of identical circuit blocks according to some embodiments of the disclosed technology.

DETAILED DESCRIPTION OF THE DISCLOSED TECHNIQUES

Various aspects of the disclosed technology relate to testing and diagnosing identical circuit blocks in a circuit. In the following description, numerous details are set forth for the purpose of explanation. However, one of ordinary skill in the art will realize that the disclosed technology may be practiced without the use of these specific details. In other instances, well-known features have not been described in detail to avoid obscuring the disclosed technology.

Some of the techniques described herein can be implemented in software instructions stored on a computer-readable medium, software instructions executed on a computer, or some combination of both. Some of the disclosed techniques, for example, can be implemented as part of an electronic design automation (EDA) tool. Such methods can be executed on a single computer or on networked computers.

Although the operations of the disclosed methods are described in a particular sequential order for convenient presentation, it should be understood that this manner of description encompasses rearrangements, unless a particular ordering is required by specific language set forth below. For example, operations described sequentially may in some cases be rearranged or performed concurrently. Moreover, for the sake of simplicity, the disclosed flow charts and block diagrams typically do not show the various ways in which particular methods can be used in conjunction with other methods.

The detailed description of a method or a device sometimes uses terms like "configure," "combine," and "update" to describe the disclosed method or the device function/ structure. Such terms are high-level descriptions. The actual operations or functions/structures that correspond to these terms will vary depending on the particular implementation and are readily discernible by one of ordinary skill in the art.

As used in this disclosure, the singular forms "a," "an," and "the" include the plural forms unless the context clearly dictates otherwise. Additionally, the term "includes" means "comprises." Moreover, unless the context dictates otherwise, the term "coupled" means electrically or electromagnetically connected or linked and includes both direct connections or direct links and indirect connections or indirect links through one or more intermediate elements not affecting the intended operation of the circuit.

Additionally, as used herein, the term "design" is intended to encompass data describing an entire integrated circuit device. This term also is intended to encompass a smaller group of data describing one or more components of an entire device such as a portion of an integrated circuit device nevertheless.

Figure 1:
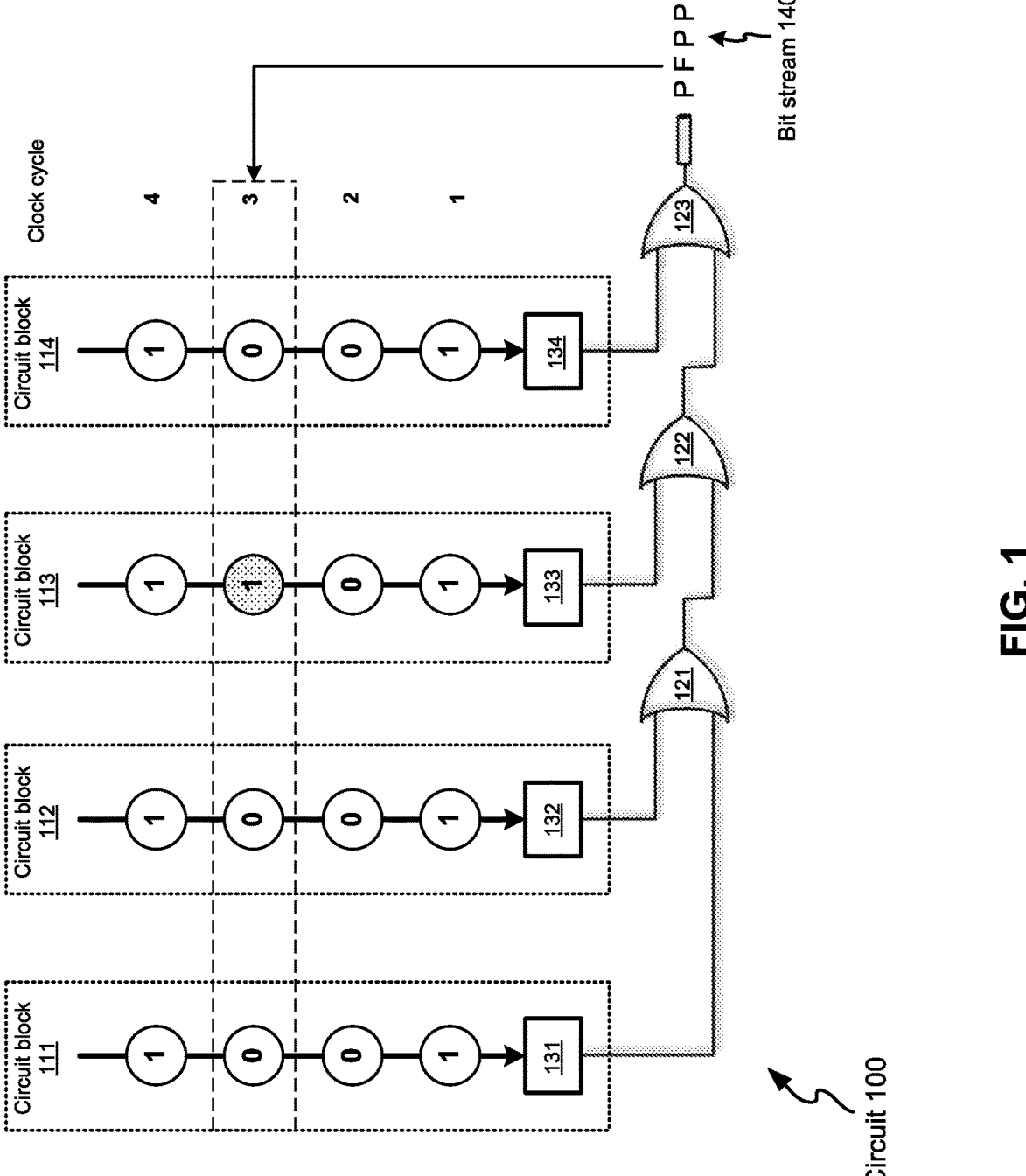
FIG. 1 illustrates an example of a circuit for testing identical circuit blocks.

FIG. 1 illustrates an example of a circuit 100 for testing identical circuit blocks. For simplicity, the circuit 100 is shown to comprise four identical circuit blocks 111, 112, 113 and 114, and each of the circuit blocks 111, 112, 113 and 114 is shown to comprises one test output port: test output ports 131, 132, 133, and 134 for the circuit blocks 111, 112, 113 and 114, respectively. Each of the test output ports 131, 132, 133, and 134 can be coupled to an output of a scan chain or an output of a test response compactor. Test response-related bits are typically shifted out from these test output ports one bit per scan clock cycle. The circuit 100 is also shown to comprise three OR gates 121, 122 and 123 serving as bit-combining devices. It should be noted that a typical circuit may have many more identical circuit blocks and each of the identical circuit blocks may have more than one test output ports.

To check whether a logic test chip is fabricated according to the design and to locate potential defects, scan testing and diagnosis is usually employed. In this widely-used technique, a series of known values (test stimuli or test pattern) are shifted into (or loaded into) state elements called scan cells through their sequential inputs. These scan cells are interconnected to form scan chains for scan testing. The shifting-in occurs by placing the integrated circuit in a special mode, known as shift mode, and then applying a series of clock pulses, called "shift/scan pulses" or "shift/scan clock pulses." Each scan clock pulse pushes a bit of test stimuli into a scan cell in each of the scan chains. This continues until all scan cells in the scan chains are filled with test pattern bits. Then, one or more clock pulses, called "capture pulses" or "capture clock pulses," are applied to the circuit as they would be in normal operation. This is referred to as capture mode. After the test pattern bits are injected into the circuit, the results of the test (test responses) are "captured" by and stored in the scan cells. The circuit then returns to shift mode, and with each additional scan clock pulse, a bit of the test responses is pushed or shifted out as each bit of a new test pattern is pushed or shifted in. The shifted-out test responses are then compared with expected results to determine and locate any errors. Shift mode and capture mode together may be called as test mode.

Various test compression techniques have been developed to reduce not only the amount of data stored on the tester but also the test time for a given test data bandwidth. In general, additional on-chip hardware before and after scan chains is inserted. The hardware (decompressor) added before scan chains is configured to decompress test stimulus coming from a tester, while the hardware (compactor) added after scan chains is configured to compact test responses captured by the scan chains. The decompressor can expand the data from n tester channels to fill m scan chains (m>n, m typically greater than one hundred) and the compactor can compact test responses from m scan chains for outputting through only a few test output ports.

During a test, test response-related bits outputted from a test output port form a bit stream. The bit stream is updated while passing through each of the identical circuit blocks being tested. In FIG. 1, a bit stream 140 is formed by test response-related bits outputted from the test output port 131. The OR gate 121 is configured to update the bit stream 140 by combining bits of the bit stream 140 with test response-related bits outputted from the test output port 132. The OR gate 122 is configured to further update the bit stream 140 by combining bits of the bit stream 140 from the OR gate 121 with test response-related bits outputted from test output port 133. The OR gate 123 is configured to still further update the bit stream 140 by combining bits of the bit stream

140 from the OR gate 122 with test response-related bits outputted from test output port 134. As such, each bit of the final bit stream 140 is a combination of bits from the circuit blocks 111, 112, 113 and 114 associated with a specific scan clock cycle, corresponding to test responses captured by specific scan cell(s) in each of the circuit blocks 111, 112, 113 and 114. In some cases, bits from another test output port of the same circuit block may also be combined into the same bit stream. In some other cases, bits from another test output port of the same circuit block may form a different bit stream.

Figure 2A:
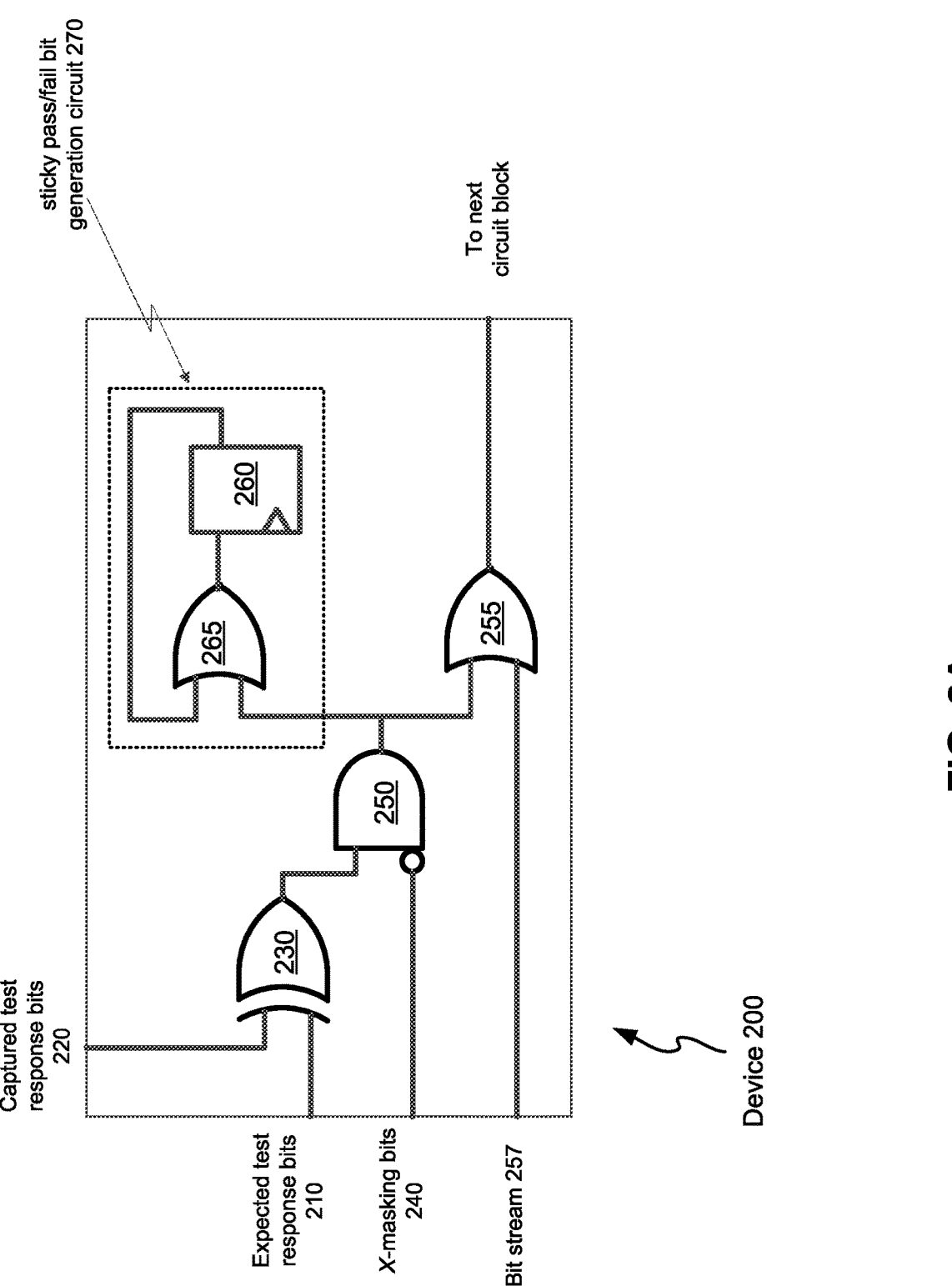
FIG. 2A illustrates an example of a device for comparison, bit combination and sticky pass/fail bit generation.

For identical circuit block testing, on-chip comparison is often employed since good-machine responses are shared. The circuit 100 may comprise a comparator for each of the test output ports 131, 132, 133, and 134. The comparator can be placed before or after the corresponding test output port. FIG. 2A illustrates an example of a device 200 for comparison, bit combination and sticky pass/fail bit generation. The device 200 comprises an XOR gate 230, an AND gate 250, two OR gates 255 and 265, and a flip-flop 260. The XOR gate 230, serving as a comparator, is configured to compare captured test response bits 220 with expected test response bits (good-machine bits) 210. Some of the test response bits 220 may be X bits. X bits are unknown bits caused by, for example, non-scan flip-flops, uninitialized memory elements, floating buses, bus contentions, internal three-state logic, unwrapped analog modules, false paths, cross-domain paths, or paths with timing closure problems. X bits should be "masked", preventing them from corrupting other test response bits through bit combination. The AND gate 250, serving as an X-masking device, is configured to mask, based on X-masking bits 240, the bits outputted from the XOR gate 230 that are X bits or bits corrupted by X bits. The OR gate 255, serving as a bit-combining device, is configured to update a bit stream 257 from a previous circuit block by combining its bits with bits outputted from the AND gate 250.

The OR gate 265 and the flip-flop 260 form a sticky pass/fail bit generation circuit 270. The flip-flop 260 is configured to store the derived sticky pass/fail bit, indicating whether a circuit block fails or passes a test. This bit becomes sticky after being changed from "0" to "1" due to detecting the first failing bit due to the OR gate 265. The sticky bit can be transported out of the circuit after a test by a network like the IJTAG network. The IJTAG network is a network conforming to the IEEE 1687 standard (IJTAG, Internal Joint Test Action Group).

Figure 2B:
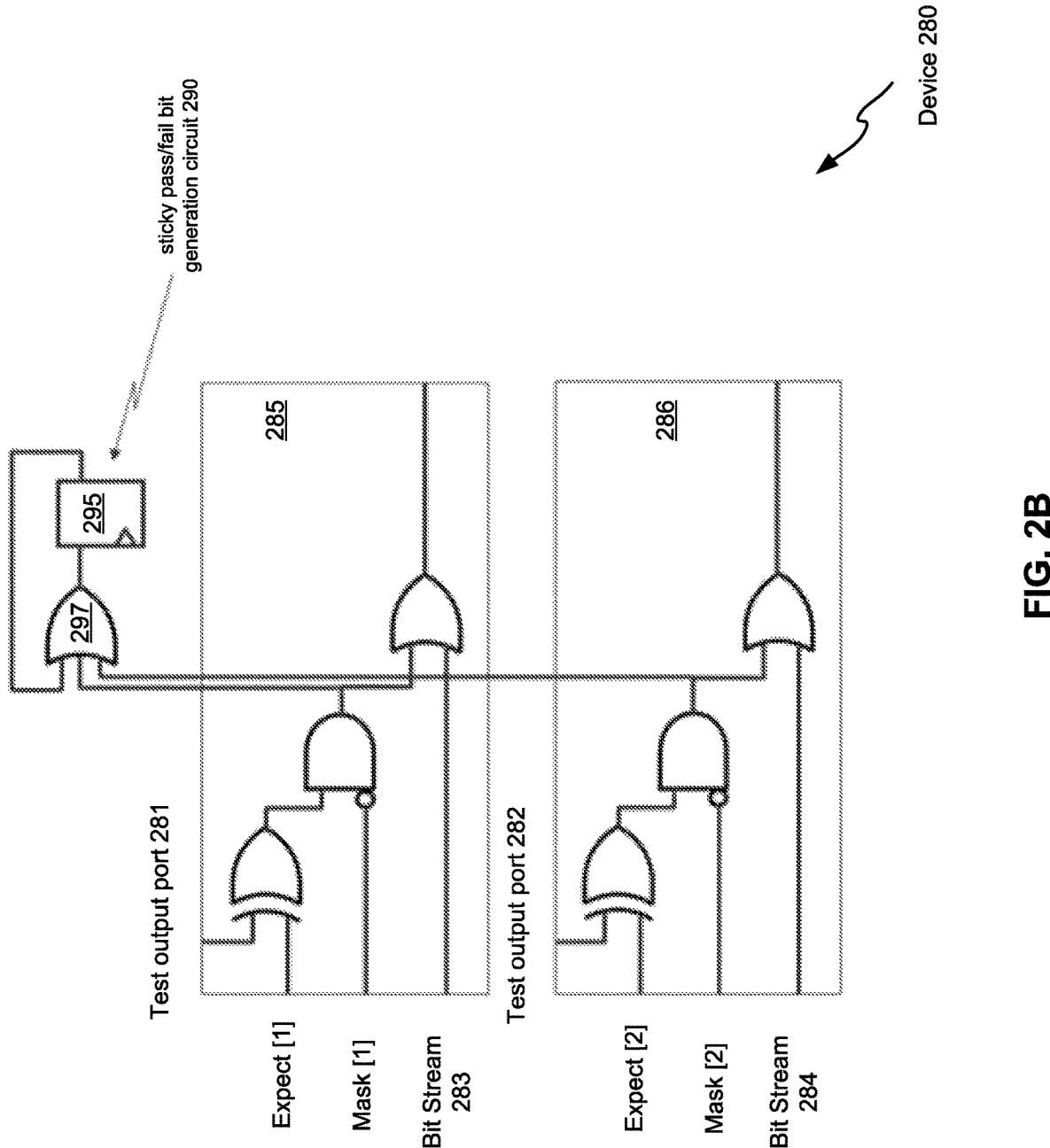
FIG. 2B illustrates an example of a device for comparison, bit combination and sticky pass/fail bit generation for a circuit block having two test output ports.

If a circuit block has more than one test output port, one single sticky pass/fail bit generation circuit may be employed for all of them. FIG. 2B illustrates an example of a device 280 for comparison, bit combination and sticky pass/fail bit generation for a circuit block having two test output ports 281 and 282. The device 280 comprises two devices 285 and 286 configured to process captured test response bits from the test output ports 281 and 282, respectively. Like the device 200 in FIG. 2A, the processing comprises comparing with expected bits, masking X bits, and updating bit streams 283 and 284. Unlike the device 200, a sticky pass/fail bit generation circuit 290 is shared between the devices 285 and 286. The first failed bit from the device 285 and the device 286 can change a bit stored in a flip flop 295 to one indicating that the circuit block fails the test. After the bit change, an OR gate 297 will ensure that the flip flop 295 keeps its content until being reset.

Referring back to FIG. 1, the circuit 100 can employ a single sticky pass/fail bit generation circuit like those shown in FIGS. 2A and 2B to indicate which circuit block fails a test. If only one circuit block fails, the bit stream 140 may be analyzed to locate defect locations. If more than one circuit block fail, however, the bit stream 140 and the sticky bits may not provide enough information for diagnosis. For example, a bit at clock cycle 3 from the circuit block 113 is detected to be a failing bit. As noted previously, however, each bit of the bit stream 140 is a combination of bits from the four circuit blocks 111-114 associated with a specific scan clock cycle. The failing bit in the observed bit stream 140 at clock cycle 3 thus can be caused by any of the circuit blocks 111-114. The sticky bits can only show which circuit blocks do not pass the test, but not at a particular clock cycle. Therefore, it is difficult, if not impossible, to identify the source, the circuit block 113. To pinpoint the failed circuit block at a particular clock cycle, more information is needed.

Figure 3:
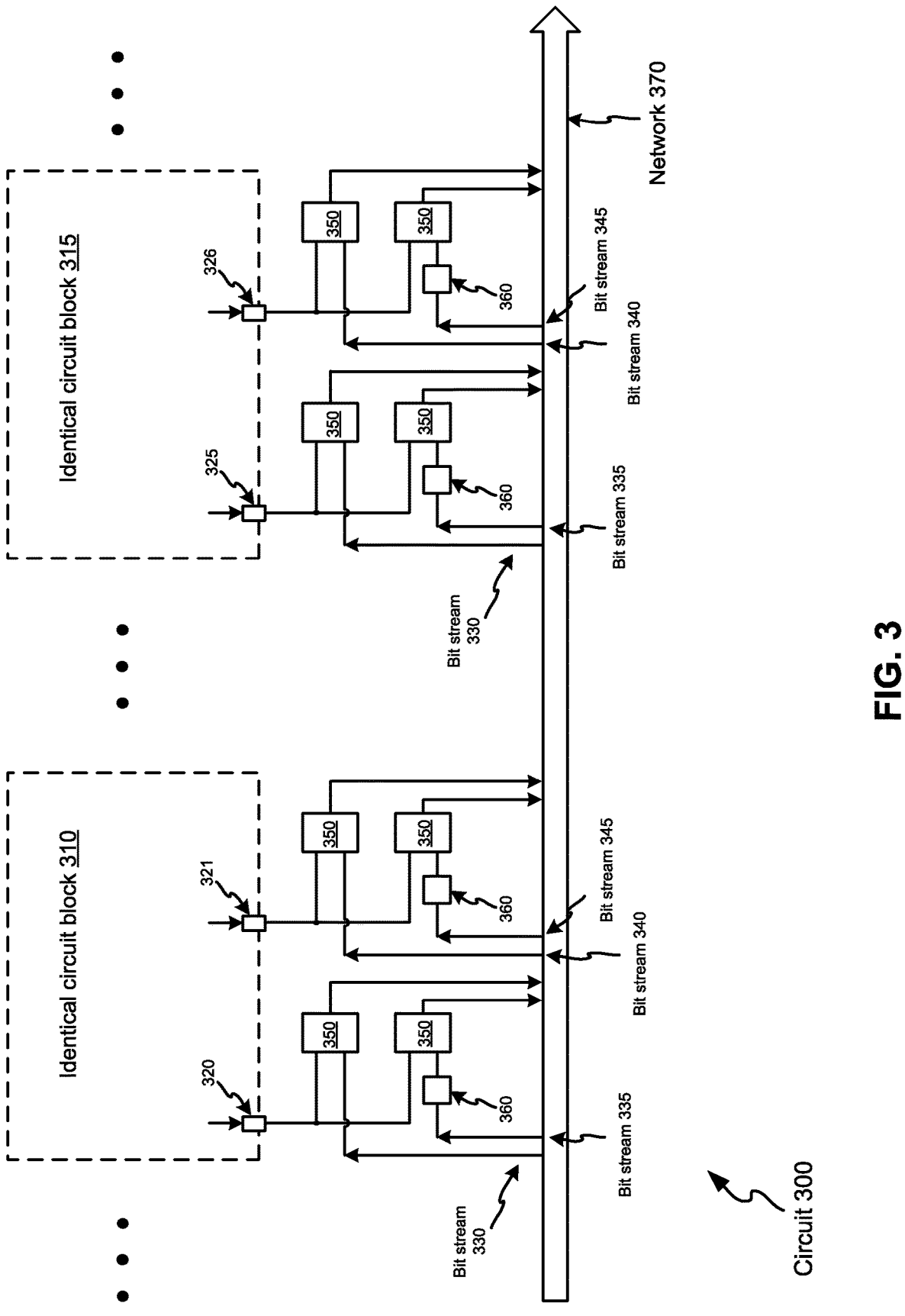
FIG. 3 illustrates an example circuit for testing a plurality of identical circuit blocks that may be implemented according to various embodiments of the disclosed technology.

FIG. 3 illustrates an example circuit 300 for testing a plurality of identical circuit blocks that may be implemented according to various embodiments of the disclosed technology. The figure shows two circuit blocks 310 and 320 in the plurality of identical circuit blocks. The circuit blocks 310 and 320 have two test output ports each: test output ports 320, 321 for the circuit block 310 and test output ports 325, 326 for the circuit block 315. Each of the test output ports 320, 321, 325 and 326 may be coupled to an output of a scan chain, an output of a test response compactor, or an output of a comparator. Test response-related bits can be shifted out of a test output port one bit per scan clock cycle. The test output ports 320 and 325 are coupled to the same part of test circuitry in each of the circuit blocks 310 and 320, and the test output ports 321 and 326 are coupled to the same part of test circuitry in each of the circuit blocks 310 and 320. It should be note that the disclosed technology can be applied to testing identical circuit blocks that have more than two test output ports or just one test output port.

The circuit 300 also comprises bit-combining devices 350, delay devices 360, and a network 370. The bit-combining devices 350 may be implemented using OR gates. The delay devices 360 may be implemented using devices comprising a register. The circuit 300 may further comprise comparators for on-chip comparison. The comparators may be implemented using XOR gates and may be placed before or after the test output ports. Some or all of the comparators, the bit-combining devices 350, and delay devices 360 may be placed inside interface devices for the network 370.

The network 370, coupled to each of the plurality of identical circuit blocks, is configured to transport bit streams 330, 335, 340 and 345. For each of the test output ports 320, 321, 325 and 326, two different bit streams are separately updated by test response-related bits through bit combination: bit streams 330 and 335 by test response-related bits from the test output port 320 and 325, and bit streams 340 and 345 by test response-related bits from the test output port 321 and 326. For the bit streams 330 and 340, the updating operation is conducted by bit combination similar to how the updating operation is conducted in FIG. 1. For the bit streams 335 and 345, however, bits of the bit streams 335 and 345 are first delayed by a preset number of scan clock cycles by the delay devices 360 before being combined with the test response-related bits by the bit-combining devices 350. The preset number of scan clock cycles can be one scan clock cycle or multiple scan clock cycles. The delay devices 360 may have a fixed delay setting or an adjustable delay setting which can be configured to delay for different numbers of scan clock cycles based on configuration data received before a test. Due to the delay devices 360, each bit of the bit streams 335 and 345 are updated by test response-related bits at scan clock cycles different from those for the circuit blocks 310 and 320 and also different from those for updating corresponding bits of the bit streams 330 and 340.

Figure 4:
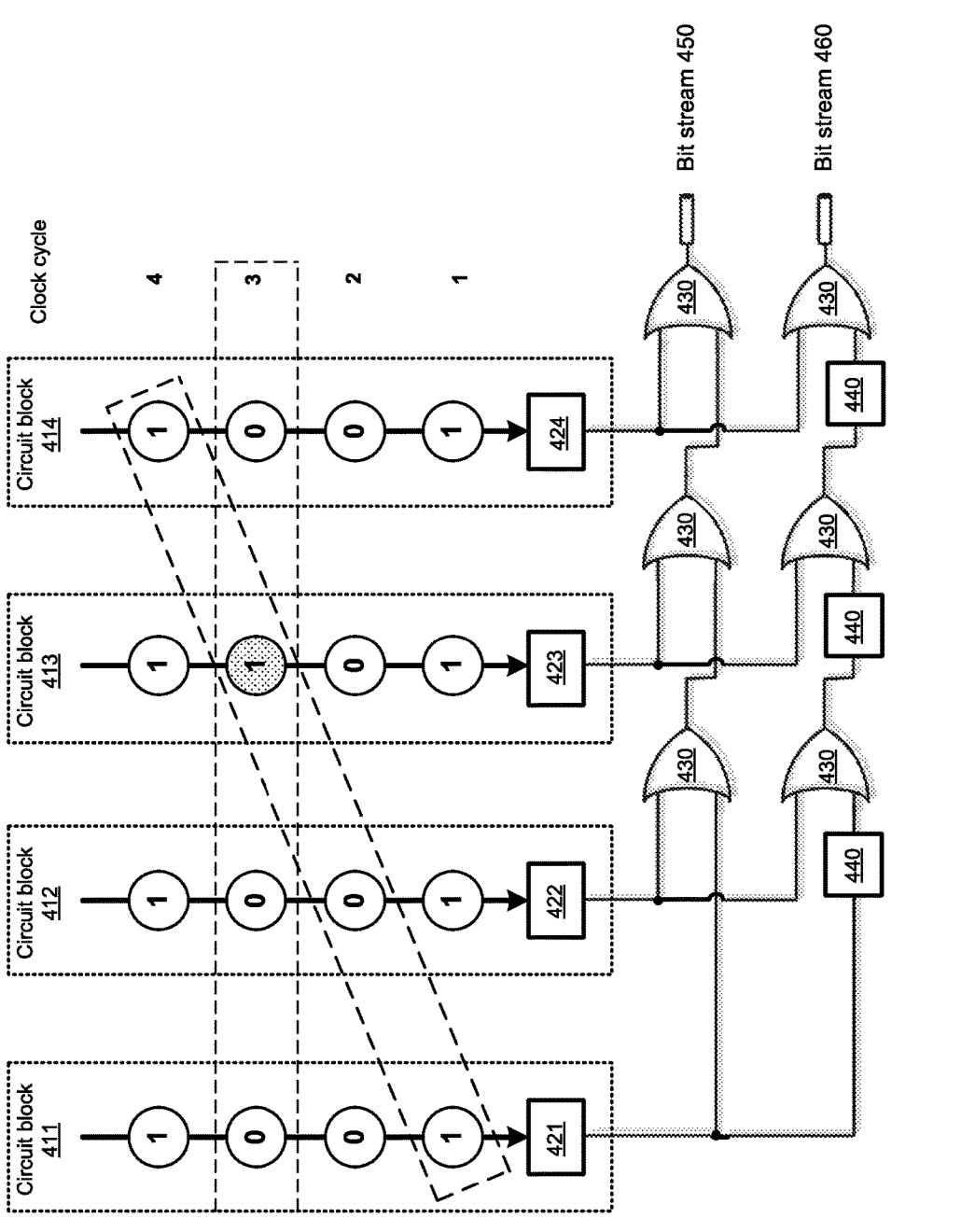
FIG. 4 illustrates an example of a circuit for testing identical circuit blocks that implements the architecture shown in FIG. 3, the identical circuit blocks being similar to the ones shown in FIG. 1.

FIG. 4 illustrates an example of a circuit 400 for testing identical circuit blocks that implements the architecture shown in FIG. 3. Like the circuit 100 in FIG. 1, the circuit 400 comprises four identical circuit blocks 411, 412, 413 and 414, and each of the circuit blocks 411, 412, 413 and 414 is shown to comprises one test output port: test output ports 421, 422, 423, and 424 for the circuit blocks 411, 412, 413 and 414, respectively. Unlike the circuit 100, the circuit 400 generates and updates two bit streams 450, 460 rather than just one by test response-related bits outputted from the test output ports 421, 422, 423, and 424. The generation and updating of the two bit streams 450, 460 is performed by six OR gates 430 serving as bit-combining devices and three delay devices 440. The bit stream 450 is generated and updated by three of the six OR gates 430 in a similar way as the bit stream 140 is generated and updated in the circuit 100 in FIG. 1. On the other hand, bits of the bit stream 460 are first being delayed by one of the three delay devices 440 for one scan clock cycle before being combined with test response-related bits from one of the test output ports 422, 423, and 424. As such, a bit of the bit stream 460 is a combination of the test response-related bits from the test output ports 421, 422, 423, and 424 at four consecutive scan clock cycles, respectively. By comparison, a bit of the bit stream 450 is a combination of the test response-related bits from the test output ports 421, 422, 423, and 424 at the same scan clock cycle. The two bit streams 450, 460 can be analyzed together to determine which of the circuit blocks 411, 412, 413 and 414 produces a failing bit at a specific clock cycle. In an example similar to the one shown in FIG. 1, the two bit streams 450, 460 can help pinpoint the circuit block 413 as the source of the failing bit of the bit stream 450 at the scan clock cycle 3 based on the overlap of test response-related bits contributing to the failing bits of the two bit streams 450, 460. As shown in FIG. 4, the bit at the scan clock cycle 3 from the test output port 423 of the circuit block 413 is the one that causes the failing bit in each of the bit streams 450, 460.

Theoretically, if there are n failing bits, (n+1) bit streams are needed to determine the locations of these failing bits. Fortunately, failing bits often are not too many and are sparsely located. Three or four bit streams may achieve satisfiable results. The third and fourth bit streams may be obtained by setting delays for 2 and 3 scan clock cycles, respectively.

Figure 5:
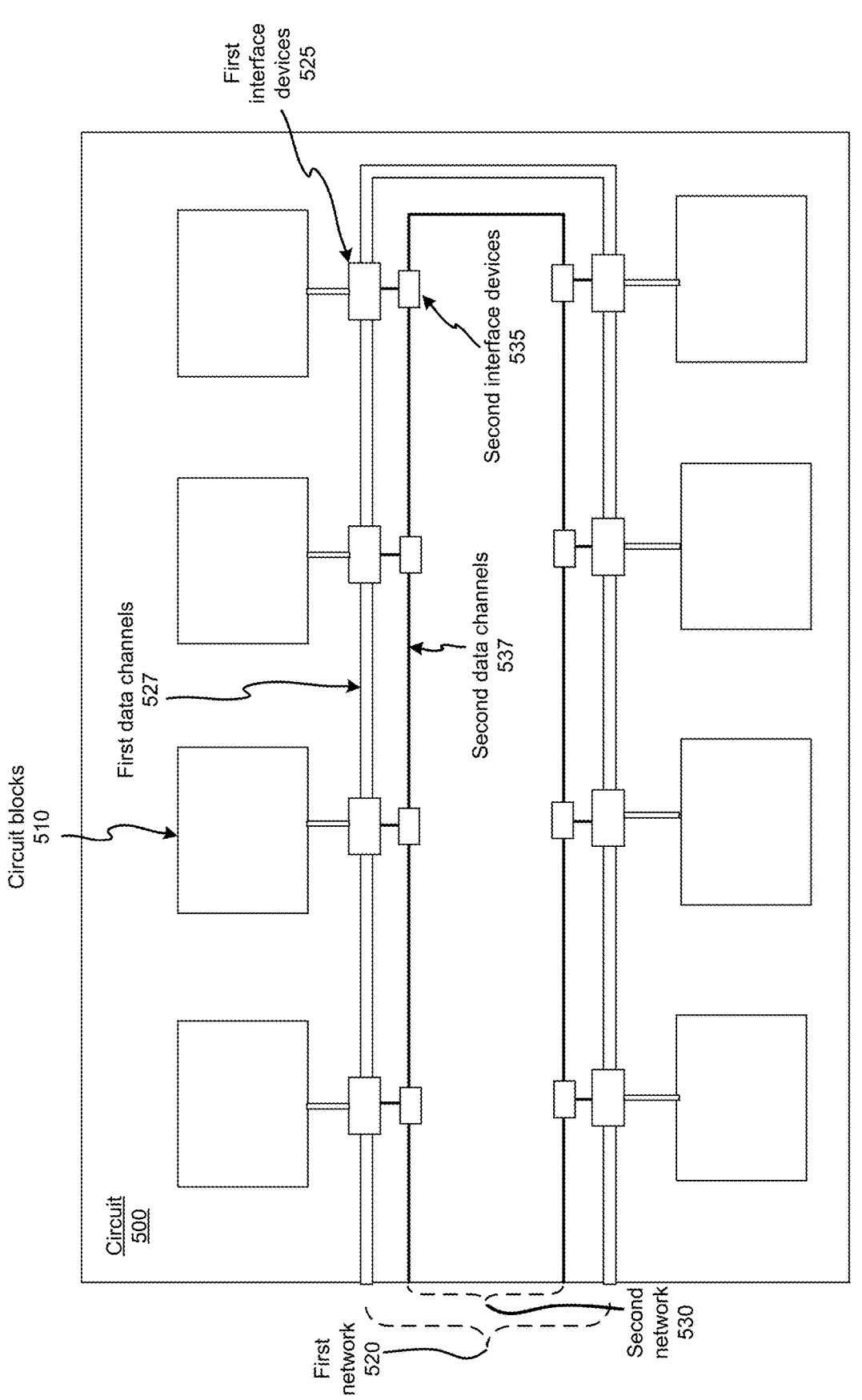
FIG. 5 illustrates an example of a system for streaming data in a circuit that may be employed for transporting test response-related bit streams according to various embodiments of the disclosed technology.

The bit streams can be transported using separate channels of a network. This architecture requires the number of output pins of the circuit to be at least the same as the number of the bit streams. Another architecture employs packet-based streaming networks which can use a smaller number of output pins. FIG. 5 illustrates an example of a system for streaming data in a circuit 500 that may be employed for transporting test response-related bit streams according to various embodiments of the disclosed technology. The system for streaming data comprises a first network 520 and a second network 530. The first network 520 comprises first data channels 527 (first data bus) and first interface devices 525. The second network 530 comprises one or more second data channels 537 (second data bus) and second interface devices 535. The first interface devices 525 comprises registers and clock signal generation logic. Each of the first interface devices 525 is coupled to ports of one of circuit blocks 510 in the circuit 500. Each of the first interface devices 525 is also coupled to one of the second interface devices 535. Inputs and outputs of the first data channels 527 can be connected to some chip-level I/Os (the GPIO pads). Inputs and outputs of the one or more second data channels 537 can also be connected to some other chip-level I/Os (the GPIO pads). While only one first network 520 and one second network 530 are shown in FIG. 5, a circuit can have multiple first networks 520 and one or more second networks 530.

The first network 520 is configurable to transport a plurality of data packets consecutively. Each of the plurality of data packets has m bits, and each of the m bits is assigned to one of the circuit blocks 510 preconfigured in an active mode. The active mode may be a mode for testing or a mode for loading/unloading data. Here m is equal to or greater than a number of the first data channels 525 used for the transporting the plurality of data packets. While the total number of the first data channels for a manufactured circuit is typically fixed, the number of the first data channels used for the transporting the plurality of data packets may be less than the total number. For example, a setup for wafer testing may not need all of the first data channels 525 while a setup for testing the same circuit in a system may take advantage of all of the first data channels 525.

Assume that the number of first data channels used for the transporting data packets is n. The first network 520 transports the data packets at a rate of one n-bit word per clock cycle, and if m is greater than n, the bit assignment to the circuit blocks 510 in the active mode for a particular n-bit word (bus word) repeats every LCM(m,n)/n clock cycles according to various embodiments of the disclosed technology. Here, LCM(m,n) is the least common multiple of m and n. In some bit assignments, bits in each of the plurality of data packets are divided into bit blocks, bits in each of the bit blocks are next to each other except bits at two ends of the block, and each of the bit blocks is assigned to one of the circuit blocks preconfigured in the active mode. Each of the first interface devices activated can be configured to keep track of the location of its data bits in each of the bus words.

Figure 6:
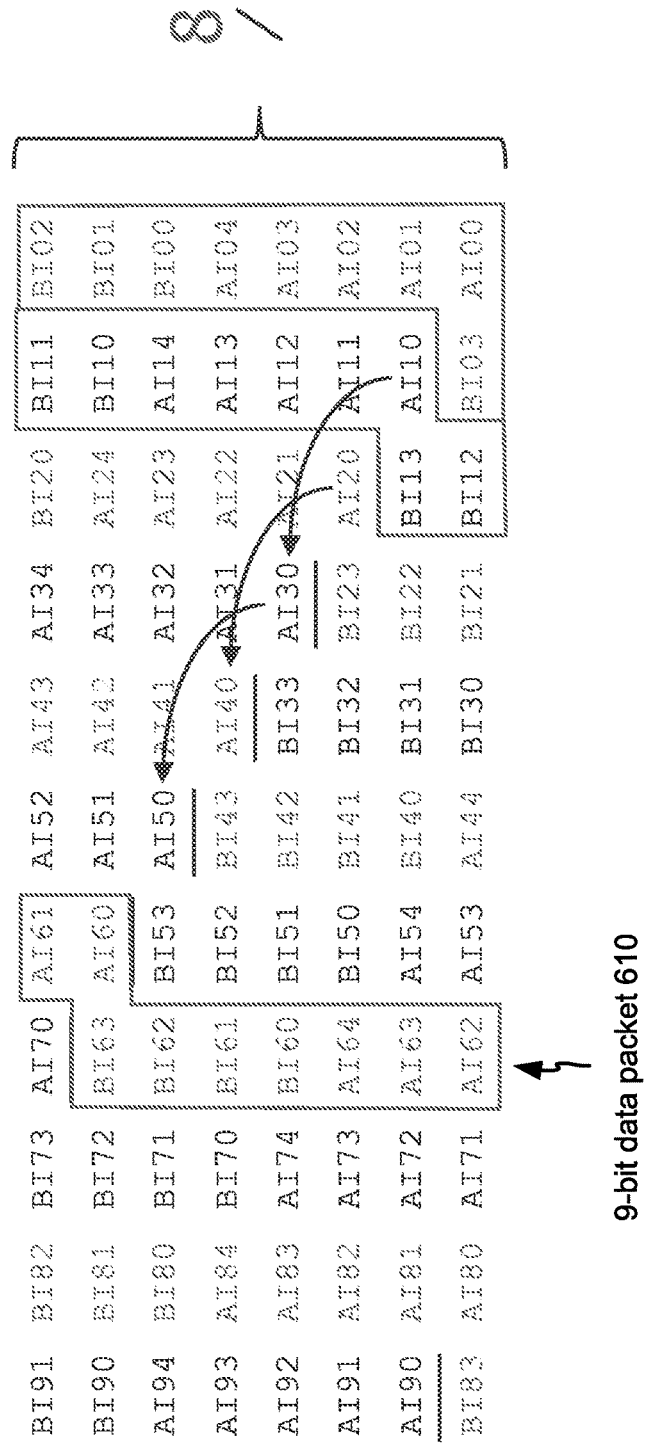
FIG. 6 illustrates an example of bit assignment for the first data channels shown in FIG. 5 used for transporting data packets according to some embodiments of the disclosed technology.

FIG. 6 illustrates an example of bit assignment for the first data channels 525 used for transporting data packets according to some embodiments of the disclosed technology. In this example, two circuit blocks (core A and core B) are being driven through the first network—exchanging data with the first network. One of them loads/unloads four bits per shift cycle of the circuit block, while the other loads/unloads five bits. The size of each data packet is therefore nine bits. In the figure, "AI" means data bits for the core A and "BI" means data bits for the core B. For the two circuit blocks to shift once, nine bits (m=9) have to be delivered. The number of the first data channels used for data streaming is eight, i.e., the bus for delivering the data is eight bits wide (n=8). The locations of the 9-bit packets within each 8-bit bus word thus rotate with each packet to use every bit of every bus word without using wasteful padding. As a result, the packet starts at the same bus bit position every nine clock cycles, i.e., repeating the same bit assignment every nine clock cycles. Further, each data packet is divided into two bit blocks. A data packet 610 in FIG. 6, for example, is divided into a bit block consisting of AI64-AI60 and a bit block consisting of BI60-BI63.

A data packet can be as wide as needed, and can occupy as many bus words as needed. The internal channel requirements (9 bits in the example shown in FIG. 6) are decoupled from the available scan pins at the chip level (8×2 I/O for scan in this case). If the packet is wider than the bus and occupies multiple bus words, the circuit block can shift less often than once every bus shift cycle but it will be possible to drive all the circuit blocks needed. Because the scan bus can usually shift data at a higher rate than the circuit blocks can shift internally, it can be possible to keep the circuit blocks shifting at their maximum rates even if they don't shift every bus clock cycle. With some implementations of the disclosed technology, the bus (the first data channels) can be re-programmed to reduce its active width such that it does not exceed the number of bits in a packet when the packet size (m) is less than the physical bus width (n).

Referring back to FIG. 5, the second network 530 is configurable to transport configuration data to the first interface devices. The configuration data comprise data for determining whether or not a first interface device in the first interface devices 530 is activated and data for determining which bit or bits of each of the plurality of data packets to be captured, replaced, or captured and replaced by each of the first interface devices activated. The second network 530 may conform to the IEEE 1687 standard (IJTAG, Internal Joint Test Action Group).

Figure 7:
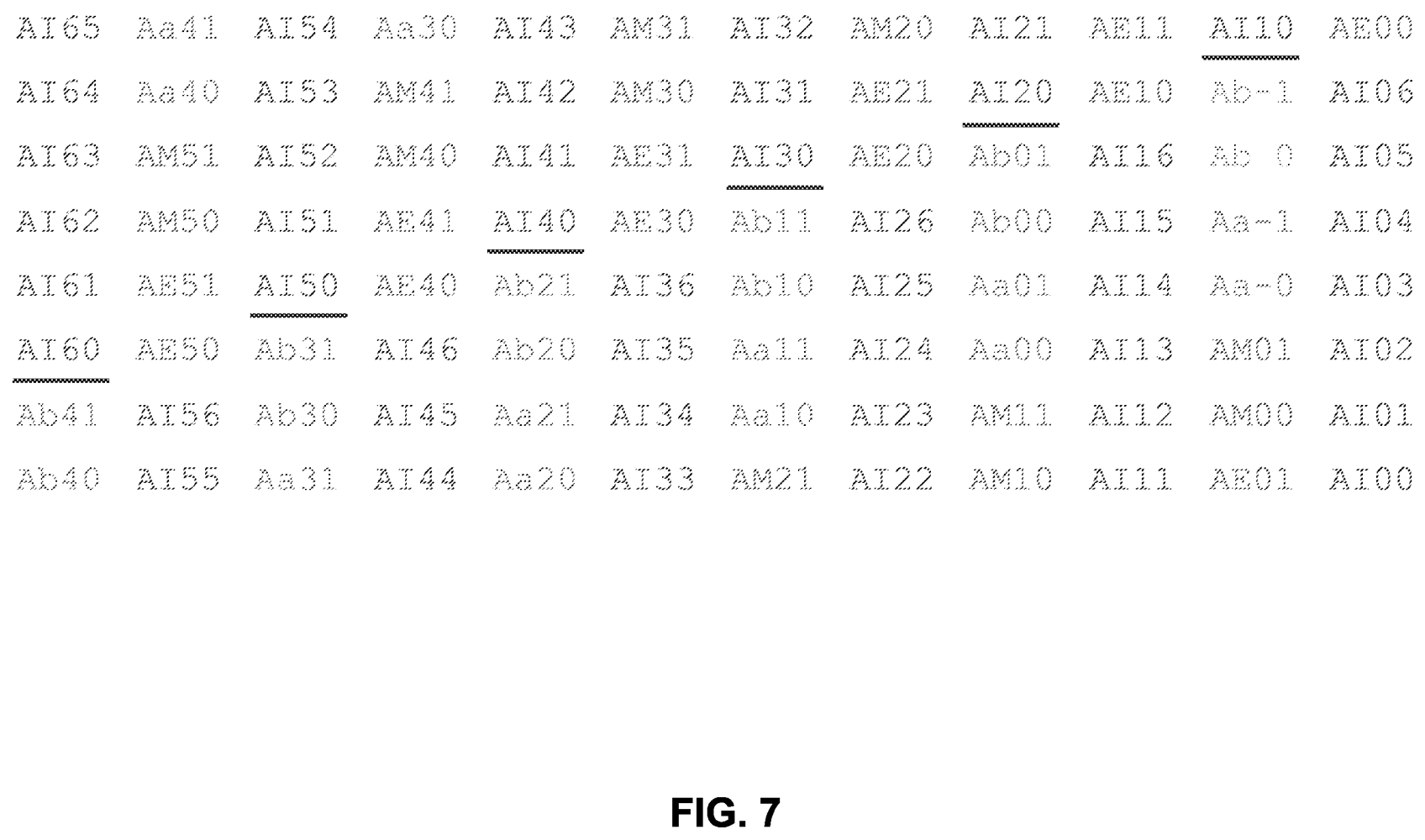

FIG. 7 illustrates an example of bit assignment for the first data channels 525 used for testing a plurality of identical circuit blocks according to some embodiments of the disclosed technology. Each of the plurality of identical circuit block has seven input channels and two test output channels. Accordingly, each data packet has seven bits allocated for the test stimuli (e.g., AI00-AI06), two bits for good-machine responses (e.g., AE00 and AE01), two bits for masking bits (e.g., AM00 and AM01), four bits for four bit streams of pass/fail status (e.g., Aa00 and Aa01 for one test output channel, Ab00 and Ab01 for the other test output channel). It should be noted that more than four bit streams can be formed. As discussed previously, the packet size can be programmable and independent of the bus width.

Figure 8:
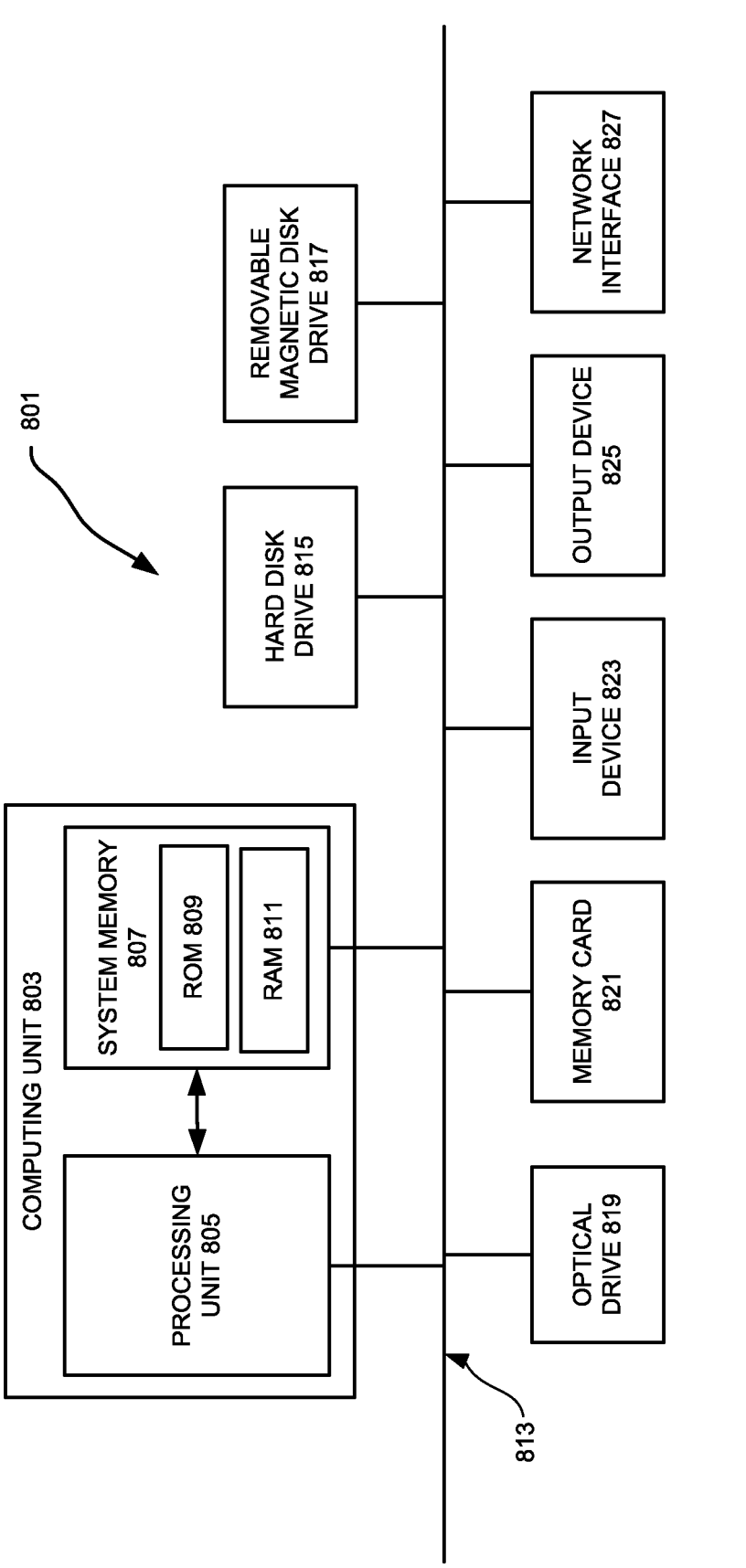
FIG. 8 illustrates an example of a programmable computer system with which various embodiments of the disclosed technology may be employed.

Various examples of the disclosed technology may be implemented through the execution of software instructions by a computing device, such as a programmable computer. Accordingly, FIG. 8 shows an illustrative example of a computing device 801. As seen in this figure, the computing device 801 includes a computing unit 803 with a processing unit 805 and a system memory 807. The processing unit 805 may be any type of programmable electronic device for executing software instructions, but it will conventionally be a microprocessor. The system memory 807 may include both a read-only memory (ROM) 809 and a random access memory (RAM) 811. As will be appreciated by those of ordinary skill in the art, both the read-only memory (ROM) 809 and the random access memory (RAM) 811 may store software instructions for execution by the processing unit 805.

The processing unit 805 and the system memory 807 are connected, either directly or indirectly, through a bus 813 or alternate communication structure, to one or more peripheral devices. For example, the processing unit 805 or the system memory 807 may be directly or indirectly connected to one or more additional memory storage devices, such as a "hard" magnetic disk drive 815, a removable magnetic disk drive 817, an optical disk drive 819, or a flash memory card 821. The processing unit 805 and the system memory 807 also may be directly or indirectly connected to one or more input devices 823 and one or more output devices 825. The input devices 823 may include, for example, a keyboard, a pointing device (such as a mouse, touchpad, stylus, trackball, or joystick), a scanner, a camera, and a microphone. The output devices 825 may include, for example, a monitor display, a printer and speakers. With various examples of the computing device 801, one or more of the peripheral devices 815-825 may be internally housed with the computing unit

803. Alternately, one or more of the peripheral devices 815-825 may be external to the housing for the computing unit 803 and connected to the bus 813 through, for example, a Universal Serial Bus (USB) connection.

With some implementations, the computing unit 803 may be directly or indirectly connected to one or more network interfaces 827 for communicating with other devices making up a network. The network interface 827 translates data and control signals from the computing unit 803 into network messages according to one or more communication protocols, such as the transmission control protocol (TCP) and the Internet protocol (IP). Also, the network interface 827 may employ any suitable connection agent (or combination of agents) for connecting to a network, including, for example, a wireless transceiver, a modem, or an Ethernet connection. Such network interfaces and protocols are well known in the art, and thus will not be discussed here in more detail.

It should be appreciated that the computing device 801 is illustrated as an example only, and it is not intended to be limiting. Various embodiments of the disclosed technology may be implemented using one or more computing devices that include the components of the computing device 801 illustrated in FIG. 8, which include only a subset of the components illustrated in FIG. 8, or which include an alternate combination of components, including components that are not shown in FIG. 8. For example, various embodiments of the disclosed technology may be implemented using a multi-processor computer, a plurality of single and/or multiprocessor computers arranged into a network, or some combination of both.

CONCLUSION

Having illustrated and described the principles of the disclosed technology, it will be apparent to those skilled in the art that the disclosed embodiments can be modified in arrangement and detail without departing from such principles. In view of the many possible embodiments to which the principles of the disclosed technologies can be applied, it should be recognized that the illustrated embodiments are only preferred examples of the technologies and should not be taken as limiting the scope of the disclosed technology. Rather, the scope of the disclosed technology is defined by the following claims and their equivalents. We therefore claim as our disclosed technology all that comes within the scope and spirit of these claims.

What is claimed is:

1. A circuit, comprising:
a plurality of identical circuit blocks, each of the plurality of identical circuit blocks comprising one or more test output ports, the one or more test output ports being coupled to outputs of scan chains, outputs of one or more test response compactors, or outputs of comparators;
a first bit-combining device and a second bit-combining device for each of the one or more test output ports for each of the plurality of identical circuit blocks;
a delay device for each of the one or more test output ports for each of the plurality of identical circuit blocks; and
a first network coupled to each of the plurality of identical circuit blocks and configured to transport a first bit stream and a second bit stream during a test,
wherein the first bit-combining device is configured to update the first bit stream by combining bits of the first bit stream with bits outputted from the each of the one or more test output ports, and the second bit-combining device is configured to update the second bit stream by combining bits of the second bit stream that are delayed by a preset number of scan clock cycles by the delay device with the bits outputted from the each of the one or more test output ports.

2. The circuit recited in claim 1, further comprising:
one or more additional bit-combining devices for the each of the one or more test output ports for each of the plurality of identical circuit blocks; and
one or more additional delay devices for the each of the one or more test output ports for each of the plurality of identical circuit blocks,
wherein each of one or more additional bit-combining devices is configured to update one of one or more additional bit streams by combining bits of the one of one or more additional bit streams that are delayed by a particular number of scan clock cycles by one of the one or more additional delay devices with the bits outputted from the each of the one or more test output ports, the one or more additional delay devices being configured to delay bits by different numbers of scan clock cycles.

3. The circuit recited in claim 1, wherein the preset number of scan clock cycles is delivered to the delay device by configuration data before the test.

4. The circuit recited in claim 1, wherein the bit-combining devices are OR gates, and each of the one or more delay devices comprises a register.

5. The circuit recited in claim 1, further comprising:
sticky pass/fail bit generation circuitry for each of the plurality of identical circuit blocks.

6. The circuit recited in claim 1, further comprising:
a second network,
wherein the first network comprises first data channels and first interface devices, the first interface devices comprising registers and clock signal generation logic, each of the first interface devices being coupled to ports of one of circuit blocks in the circuit comprising the plurality of identical circuit blocks, the first network configurable to transport a plurality of data packets consecutively, each of the plurality of data packets having m bits, each of the m bits being assigned to one of the circuit blocks preconfigured in an active mode, m being equal to or greater than a number of first data channels used for the transporting the plurality of data packets, and
wherein the second network comprises one or more second data channels and second interface devices, each of the first interface devices being coupled to one of the second interface devices, the second network configurable to transport configuration data to the first interface devices, the configuration data comprising data for determining whether or not a first interface device in the first interface devices is activated and data for determining which bit or bits of each of the plurality of data packets to be captured, replaced, or captured and replaced by each of the first interface devices activated.

7. The circuit recited in claim 1, wherein bits of the first bit stream and bits of the second bit stream are arranged in data packets transported in the first network.

8. One or more computer-readable media storing computer-executable instructions for causing a computer to perform a method, the method comprising:
creating a circuit in a circuit design, the circuit comprising:
a plurality of identical circuit blocks, each of the plurality of identical circuit blocks comprising one or more test output ports, the one or more test output ports being coupled to outputs of scan chains, outputs of one or more test response compactors, or outputs of comparators;

a first bit-combining device and a second bit-combining device for each of the one or more test output ports for each of the plurality of identical circuit blocks;

a delay device for each of the one or more test output ports for each of the plurality of identical circuit blocks; and a first network coupled to each of the plurality of identical circuit blocks and configured to transport a first bit stream and a second bit stream during a test, wherein the first bit-combining device is configured to update the first bit stream by combining bits of the first bit stream with bits outputted from the each of the one or more test output ports, and the second bit-combining device is configured to update the second bit stream by combining bits of the second bit stream that are delayed by a preset number of scan clock cycles by the delay device with the bits outputted from the each of the one or more test output ports.

9. The one or more computer-readable media recited in claim 8, wherein the circuit further comprises:

one or more additional delay devices for the each of the one or more test output ports for each of the plurality of identical circuit blocks, wherein each of one or more additional bit-combining devices is configured to update one of one or more additional bit streams by combining bits of the one of one or more additional bit streams that are delayed by a particular number of scan clock cycles by one of the one or more additional delay devices with the bits outputted from the each of the one or more test output ports, the one or more additional delay devices being configured to delay bits by different numbers of scan clock cycles.

10. The one or more computer-readable media recited in claim 8, wherein the preset number of scan clock cycles is delivered to the delay device by configuration data before the test.

11. The one or more computer-readable media recited in claim 8, wherein the bit-combining devices are OR gates, and each of the one or more delay devices comprises a register.

12. The one or more computer-readable media recited in claim 8, wherein the circuit further comprises:

sticky pass/fail bit generation circuitry for each of the plurality of identical circuit blocks.

13. The one or more computer-readable media recited in claim 8, wherein the circuit further comprises:

a second network, wherein the first network comprises first data channels and first interface devices, the first interface devices comprising registers and clock signal generation logic, each of the first interface devices being coupled to ports of one of circuit blocks in the circuit comprising the plurality of identical circuit blocks, the first network configurable to transport a plurality of data packets consecutively, each of the plurality of data packets having m bits, each of the m bits being assigned to one of the circuit blocks preconfigured in an active mode, m being equal to or greater than a number of first data channels used for the transporting the plurality of data packets, and wherein the second network comprises one or more second data channels and second interface devices, each of the first interface devices being coupled to one of the second interface devices, the second network configurable to transport configuration data to the first interface devices, the configuration data comprising data for determining whether or not a first interface device in the first interface devices is activated and data for determining which bit or bits of each of the plurality of data packets to be captured, replaced, or captured and replaced by each of the first interface devices activated.

14. The one or more computer-readable media recited in claim 8, wherein bits of the first bit stream and bits of the second bit stream are arranged in data packets transported in the first network.

* * * * *